United States Patent [19]

Lytle et al.

[11] Patent Number: 5,409,567
[45] Date of Patent: Apr. 25, 1995

[54] METHOD OF ETCHING COPPER LAYERS

[75] Inventors: William H. Lytle; Kevin H. Chang, both of Chandler; Peter C. East, Mesa, all of Ariz.

[73] Assignee: Motorola, Inc., Schaumburg, Ill.

[21] Appl. No.: 234,205

[22] Filed: Apr. 28, 1994

[51] Int. Cl.[6] .............................. B44C 1/22; C23F 1/00
[52] U.S. Cl. ................................. 156/656; 156/659.1; 156/666; 252/79.2
[58] Field of Search .................... 156/656, 659.1, 666, 156/901, 902; 430/313, 318; 427/96, 98; 252/79.2, 79.4, 79.5

[56] References Cited

U.S. PATENT DOCUMENTS

| | | | |
|---|---|---|---|
| 4,354,895 | 10/1982 | Ellis | 156/902 X |
| 5,242,535 | 9/1993 | Tamhaukar et al. | 156/901 X |

*Primary Examiner*—William Powell
*Attorney, Agent, or Firm*—Aaron B. Bernstein

[57] ABSTRACT

A method for etching a composite copper layer (40) of plated copper (20) overlying physical vapor deposited copper (30) comprises etching the plated copper (20) at a rate less than the rate of etch of the physical vapor deposited copper (30). The etching may be accomplished with an aqueous solution of ammonium peroxydisulfate with molar concentrations of ammonium ions between 0.0438 and 0.1052, at a temperature between 30° and 35° C. and with the pH buffered to remain at a value between 1 and 1.8.

16 Claims, 4 Drawing Sheets

METHOD OF ETCHING COPPER LAYERS

BACKGROUND OF THE INVENTION

The present invention relates in general to processing semiconductor devices and, more particularly, to etching composite copper layers on semiconductor devices.

Historically, passive components such as capacitors and inductors required for tuning, LC tanks, AC coupling, impedance matching and filtering requirements, were mounted external to semiconductor devices containing active components. External mounting creates problems that a module designer must take into account when perfecting the design. These problems may include parasitics associated with the interface between the active and external passive devices, higher costs associated with additional space requirements and higher part count. In addition reliability may be compromised due to the higher part count and added connections that external mounting requires. Despite these drawbacks, external mounting has been the industry's practice due to the inability to effectively integrate passive components with active semiconductor devices.

One of the major problems has been the inability to form the patterned structures required, in a manner consistent with semiconductor processing techniques, with sufficient accuracy. Attempts at integrating inductors, for example, have consisted of deposited aluminum or gold films to maximum thicknesses off approximately 3 microns. These films are then etched to produce the desired structures. However, the wet etch techniques employed have resulted in less than desirable results, caused by high etch rates, non-uniformity and under cutting. Dry etch techniques, used extensively to accurately etch aluminum films 1 micron or less thick, are too slow and/or costly for etching films greater than 1 micron. These aluminum or gold inductors also suffer from high series resistance due to their thin structure and relatively high resistivity as compared to copper.

Hence, to take advantage of copper's low relative resistivity and low cost with respect to other metals such as gold, a need exists for a method of forming thick copper layers with accurately dimensioned patterns on semiconductor devices.

DETAILED DESCRIPTION OF THE DRAWINGS

Figure 1:
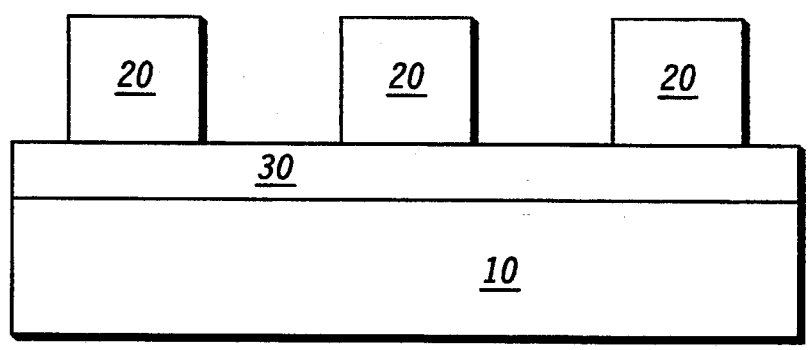
FIG. 1 is a simplified side view cross section of a structure that could be etched by a preferred method.

Thick copper layers are readily formed by plating methods. However, to take advantage of electro-plating, a uniform conductive layer must cover the surface to be plated. Consequently, in the manufacture of semiconductor devices, a composite copper layer is utilized. This copper composite layer is most readily formed by a physical vapor deposition of a thin copper film followed by the formation of a thicker copper layer using common electro-plating techniques. FIG. 1 shows a cross-section view of such a structure. Substrate 10 is overlaid with physical vapor deposited copper film 30. Plated copper layers 20 have been formed by overlaying film 30 with a patterned photoresist layer and then electro-plating. The photoresist layer prevents plating from occurring in those areas the photoresist covers. FIG. 1, then, shows the structure after the photoresist has been removed.

Figure 2:
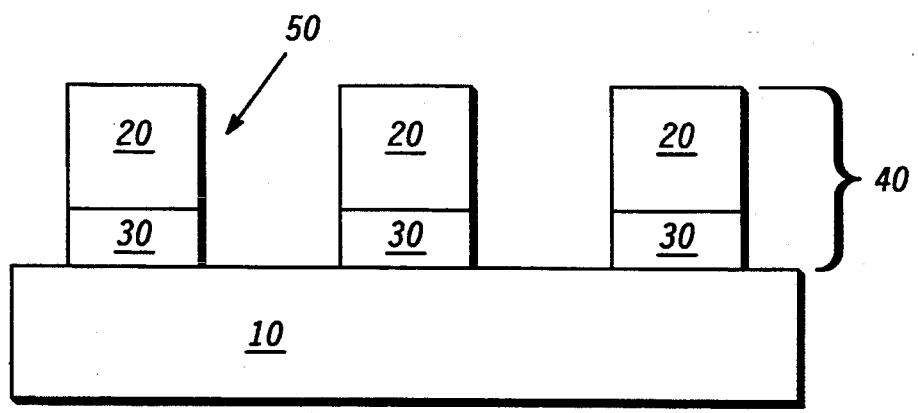
FIG. 2 is a simplified side view cross section of a structure after etching by a preferred method.

Commercially available copper etching solutions, such as MacDermit MU-B/MU-14, etch plated copper at a rate faster than physical vapor deposited copper. Referring to FIG. 2, immersion of the structure from FIG. 1 in a commercially available solution to remove film 30 and form electrically isolated copper composite layers 40 will result in significant removal of plated copper. This removal of copper can result in changes to the height, length and width of plated copper layers 20, making them unusable. Attempts to limit this effect, by plating a non-reactive metal over the plated copper layers 20, or applying a second photoresist layer over the plated copper layers 20, are additional steps that increase complexity and cost. In addition, any protection etch resistant layers overlaying the plated copper layers 20 would only prevent loss of height, while not preventing changes to length or width caused by etching of the sidewalls 50. This problem could be reduced or eliminated by an etch solution that would etch the physical vapor deposited copper at a significantly higher rate than the plated copper.

Ammonium peroxydisulfate is an example of a copper etchant known to one skilled in the art. Normally ammonium peroxydisulfate is used in aqueous solutions at concentrations of at least 0.44 moles per liter, (in such solutions the concentration of ammonium ions would be 0.88 moles per liter and the concentration of peroxydisulfate would be 0.44 moles per liter). It is believed that ammonium peroxydisulfate etches copper by the formation of copper ammonia complexes such as $Cu(NH_3)_4^{+2}$ in the presence of a strong oxidizing agent, such as the peroxydisulfate ion $(S_2O_8)^{-2}$. The equilibrium reactions are shown as reaction (A) and (B).

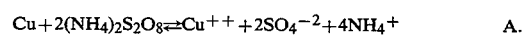

Figure 3:
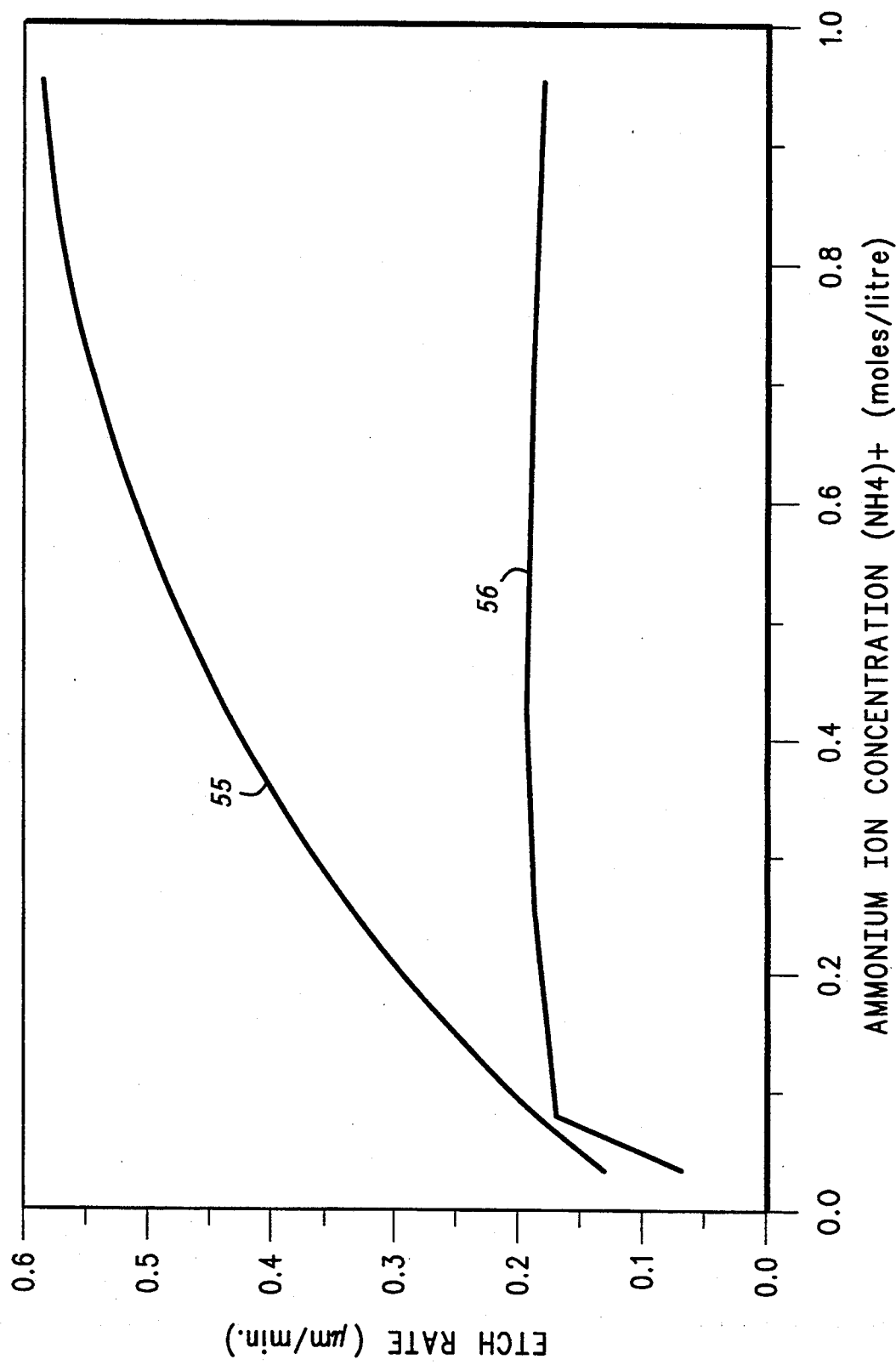
FIG. 3 is a chart representing the variation of copper etch rates with ammonium ion concentration.

Therefore it would be expected that the copper etch rate would decrease as the concentration of ammonium ions in solution decreased. FIG. 3 shows the variation of copper etch rates for both plated (curve 55) and physical vapor deposited copper (curve 56) over a range of concentrations of ammonium ions between 0 and 1 mole per liter. While the expected decrease in the etch rate of plated copper is evident, it was not expected that the etch rate of physical vapor deposited copper would remain relatively constant. It can be seen that the etch rate of physical vapor deposited copper does not decrease significantly until the ammonium ion concentration is less than approximately 0.088 moles per liter. It will be understood by those skilled in the art that the values associated with the various charts and appearing on the axis are merely intended to be indicative of operating values, and that variations will be expected, depending on particular conditions and applications.

Figure 4:
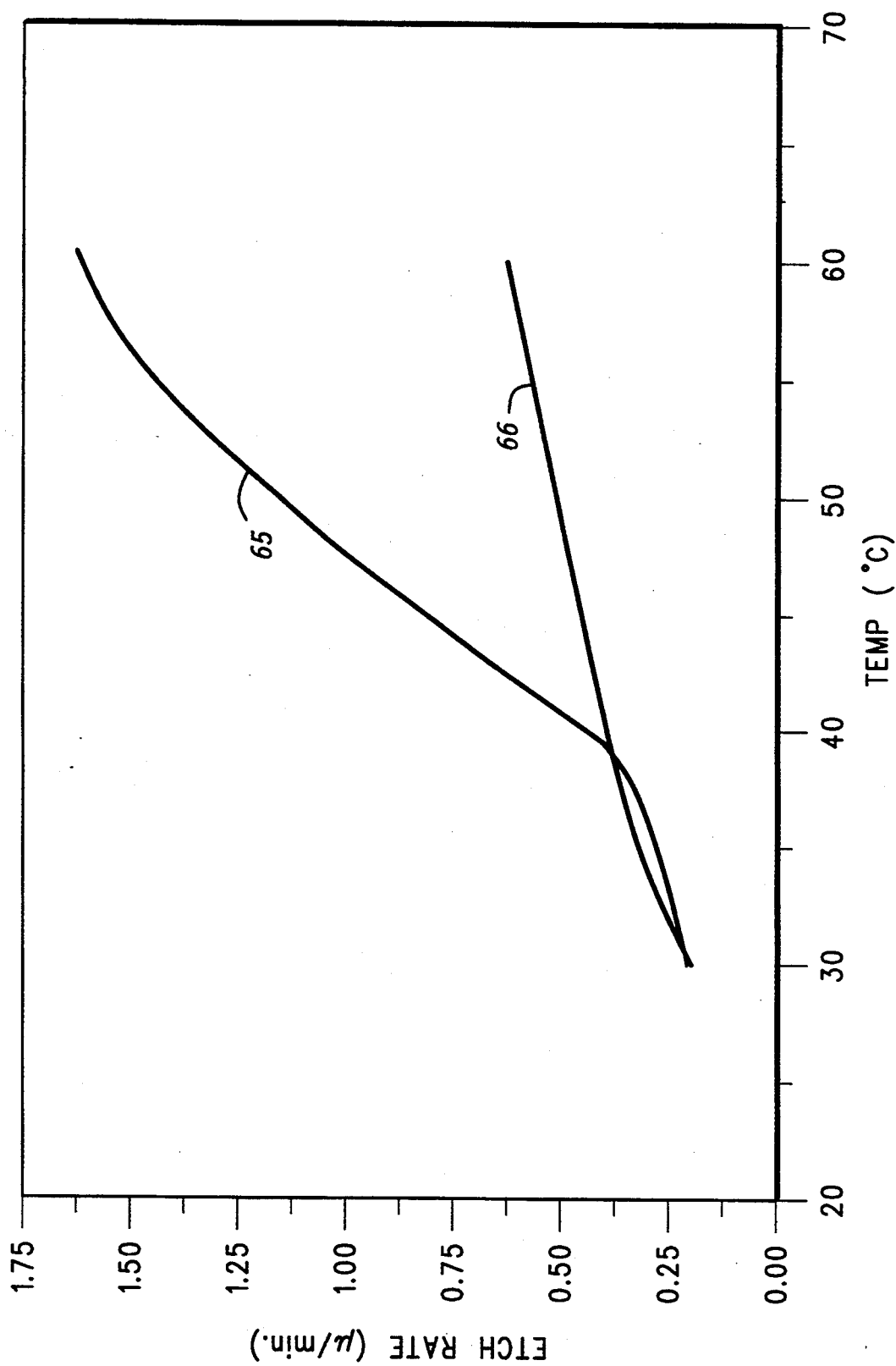
FIG. 4 is a chart representing the variation of copper etch rates with temperature.

FIG. 4 shows the effect of temperature on the etch rate of an approximately 0.088 moles per liter aqueous solution of ammonium peroxydisulfate on both plated (curve 65) and physical vapor deposited copper (curve 66). It can be seen that while physical vapor deposited copper increases in etch rate in a linear manner, as the temperature increases, the plated copper begins to increase its etch rate non-linearly above 40° C. This unexpected result serves to indicate a preferred temperature range between 30° and 40° C., in order to maintain as low an etch rate as possible for the plated copper, relative to physical vapor deposited copper.

Figure 5:
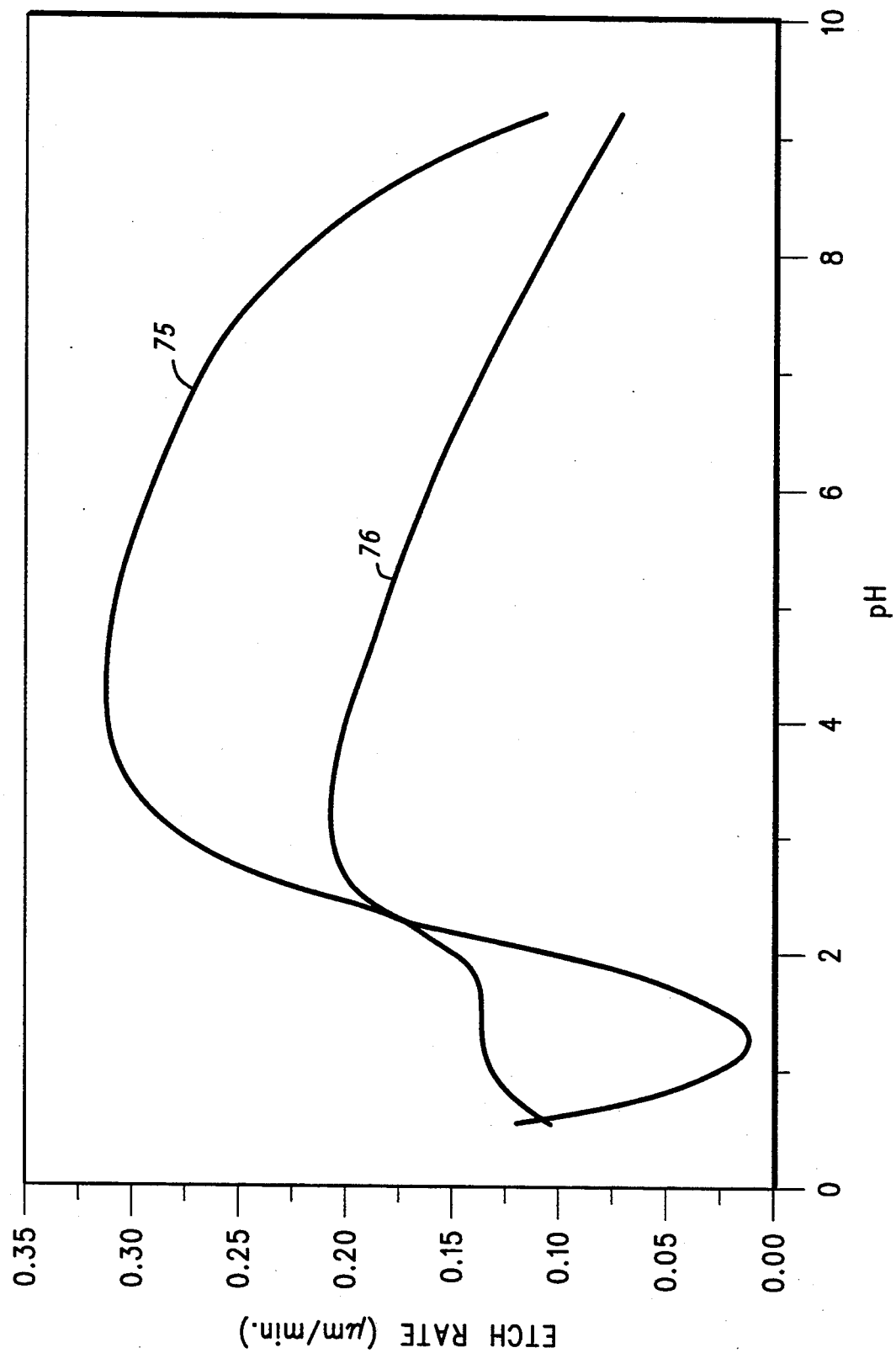
FIG. 5 is a chart representing the variation of copper etch rates with the etch solution's pH.

FIG. 5 shows the effect of pH on an approximately 0.088 moles per liter aqueous solution of ammonium peroxydisulfate on both plated (curve 75) and physical vapor deposited copper (curve 76). The observed pH of an approximately 0.088 moles per liter aqueous solution of ammonium peroxydisulfate, was 2.6. The pH was adjusted by the addition of ammonium hydroxide or sulfuric acid to either raise or lower it respectively. As the chart indicates, the etch rate of plated copper begins to decrease very rapidly at approximately 3.2. At a pH of approximately 2.6 the etch rates of the two materials are approximately equal, and in the range of 2.6 to 0.8, the plated copper etches more slowly than the physical vapor deposited copper. As indicated by the chart, etch rate ratios (plated/physical vapor deposited) of one half, and better, are achievable.

It should be noted that the calculated pH of an approximately 0.088 moles per liter aqueous solution of ammonium peroxydisulfate is 5.16. The observed pH of 2.6, is most likely due to some decomposition, over time, of the peroxydisulfate ion by the reaction (C), appearing below. It is believed that this decomposition does not effect the overall composition of the solution as less that 3% of the ammonium peroxydisulfate need decompose to lower the pH from 5.16 to 2.6.

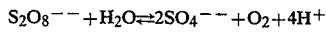

$$S_2O_8^{--} + H_2O \rightleftarrows 2SO_4^{--} + O_2 + 4H^+ \qquad C.$$

Furthermore, it will be understood by those skilled in the art that the pH may be controlled by buffering, etc., to achieve the desired pH.

In view of the forgoing discussion, a means is realized for etching copper composite layers with an etch rate for physical vapor deposited copper that is significantly greater than the etch rate of plated copper. In view of the above discussion and accompanying figures, the preferred method comprises exposing a composite copper layer to an aqueous solution of ammonium peroxydisulfate with a concentration of ammonium ions between approximately 0.1 and 0.02 moles per liter at a temperature between 30° and 35° C., and with the pH buffered to remain at a value between 1 and 1.8. It will be readily recognized by those skilled in the art that various other combinations of these parameters may be used while still obtaining the benefits of the present invention. For example, pH ranges of 0.8 to 2.6, as well as others, will be effective. Additionally, temperature ranges of 10° to 60° C., as well as others, will be effective. Furthermore, molar concentrations of ammonium ions of 0.01 and 0.2, as well as others, will be effective. Using the ranges discussed, advantageous etch rate ratios (plated/physical vapor deposited) of one half, as well as others, will be achieved.

It should be understood that materials other than ammonium peroxydisulfate may be used. The ammonium ion could be replaced with any other monodentate ligand, for example triethylamine, ethanolamine, dimethylsulfoxide or phenol, that shares the characteristics of having a pKa of between 3–5 and a formation constant with $CU^{+2}$ on the order of $3 < \log K_1 < 6$. In addition, the peroxydisulfate may be replaced with any other oxidizing agent both stable at the required pH and with a redox potential greater than 0.35 v, for example chlorite, bromate, perchlorate, permanganate or dichromate.

While specific embodiments of the present invention have been shown and described, further modifications and improvements will occur to those skilled in the art. It is understood that the invention is not limited to the particular forms shown, but rather the invention encompasses all subject matter defined by the scope of the appended claims.

We claim:

1. A method of etching comprising the steps of:
   providing a composite copper layer;
   providing an aqueous etch solution comprising a concentration of ammonium ions, a concentration of peroxydisulfate ions and a pH, the pH being within a range of 1.0 to 1.8;
   heating said etch solution to a first temperature; and
   disposing said etch solution on said composite copper layer.

2. The method of claim 1 wherein the copper composite layer comprises a first layer of copper formed by physical vapor deposition and a second layer of copper formed by electroplating.

3. The method of claim 1, wherein the step of heating comprises heating said etch solution to a range of 30° to 35° C.

4. The method of claim 1 wherein the step of disposing the etch solution comprises immersing said composite copper layer into said etch solution.

5. The method of claim 1 wherein the concentration of ammonium ions is between 0.1 and 0.02 moles per liter.

6. A method for etching a composite copper layer comprising plated copper overlying physical vapor deposited copper, the method comprising the steps of:
   exposing the composite copper layer to an etch solution; and
   concurrently etching the plated copper at a first rate and the physical vapor deposited copper at a second rate, wherein the first rate is less than the second rate.

7. The method of claim 6 wherein the etch solution comprises an aqueous solution comprising a concentration of ammonium ions and a concentration of peroxydisulfate ions and wherein the concentration of ammonium ions is between 0.1 and 0.02 moles per liter.

8. The method of claim 6 further comprising heating the etch solution to within a temperature range of 30° to 35° C.

9. The method of claim 6 wherein the step of exposing the composite copper layer to an etch solution comprises immersing the composite copper layer into the etch solution.

10. The method of claim 7 wherein the aqueous solution of ammonium peroxydisulfate has a pH within a range of 1.0 to 1.8.

11. The method of claim 6, wherein the first rate is less than or equal to one half of the second rate.

12. The method of claim 6, wherein the step of exposing the copper composite layer to an etch solution comprises exposing the copper composite layer to a solution comprising a monodentate ligand in combination with an oxidizing agent.

13. The method of claim 12, wherein the monodentate ligand has a pKa between 3 and 5 and a formation constant with $Cu^{+2}$, log $K_1$, between 3 and 6.

14. The method of claim 12, wherein the monodentate ligand is selected from the group triethylamine, ethanolamine, dimethylsulfoxide and phenol.

15. The method of claim 12, wherein the oxidizing agent has a redox potential greater than 0.35 V.

16. The method of claim 12, wherein the oxidizing agent is selected from the group chlorite, bromate, perchlorate, permangate and dichromate.

* * * * *